(12) United States Patent
Tokuda et al.

(10) Patent No.: US 11,109,482 B2
(45) Date of Patent: Aug. 31, 2021

(54) ELECTRONIC DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Kota Tokuda, Kawasaki (JP); Nobuhiro Yamamoto, Yokohama (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 42 days.

(21) Appl. No.: 16/555,370

(22) Filed: Aug. 29, 2019

(65) Prior Publication Data

US 2020/0305280 A1    Sep. 24, 2020

(30) Foreign Application Priority Data

Mar. 19, 2019 (JP) .............................. JP2019-051542

(51) Int. Cl.
*H05K 1/00*      (2006.01)
*H05K 1/02*      (2006.01)
(Continued)

(52) U.S. Cl.
CPC ............. *H05K 1/113* (2013.01); *H05K 1/119* (2013.01); *H05K 13/0465* (2013.01)

(58) Field of Classification Search
CPC .... H05K 1/119; H05K 13/0465; H05K 1/113; H05K 1/00; H05K 1/02; H05K 1/11; H05K 3/24; H05K 3/3415
USPC ..... 361/767; 360/234.3, 244.1, 244.7, 245.4, 360/245.9, 264.2; 174/84 R, 250; 29/603.02, 603.03, 603.04, 852
See application file for complete search history.

(56) References Cited

U.S. PATENT DOCUMENTS 4,515,304 A * 5/1985 Berger ................. H05K 3/3415
                                                                   228/136
6,163,443 A * 12/2000 Hatagami ................ G11B 5/40
                                                                     360/323

(Continued)

FOREIGN PATENT DOCUMENTS

JP      2004-356565 A    12/2004
JP      2013-232261 A    11/2013
(Continued)

*Primary Examiner* — Xiaoliang Chen
(74) *Attorney, Agent, or Firm* — Oblon, McClelland, Maier & Neustadt, L.L.P.

(57) ABSTRACT

According to one embodiment, an electronic device includes a flexible printed wiring board includes an insulating layer, a plurality of connection pads provided on one side of the insulating layer and constituting a group, and a pad provided on another surface side of the insulating layer and having heat conductivity, wherein the pad overlaps one or more connection pads positioned at an outer edge of the group of connection pads via the insulating layer and comprises a portion extending on the outside of the connection pad on the outer edge, and a connection member includes a plurality of connection terminals connected to the connection pads via a solder.

7 Claims, 10 Drawing Sheets

(51) Int. Cl.
*H05K 1/11* (2006.01)
*H05K 3/24* (2006.01)
*G11B 5/48* (2006.01)
*G11B 5/55* (2006.01)
*G11B 5/60* (2006.01)
*G11B 5/127* (2006.01)
*G11B 5/584* (2006.01)
*H05K 13/04* (2006.01)

(56) References Cited

U.S. PATENT DOCUMENTS

| | | | | |
|---|---|---|---|---|
| 7,139,154 B2* | 11/2006 | Iwahara | ............... | G11B 5/4833 360/245.9 |
| 8,283,570 B2 | 10/2012 | Tomura et al. | | |
| 8,295,013 B1* | 10/2012 | Pan | ................ | G11B 5/486 360/245.4 |
| 8,295,014 B1* | 10/2012 | Teo | ................ | G11B 5/486 360/245.9 |
| 8,325,446 B1* | 12/2012 | Liu | ................ | G11B 5/4833 360/245.9 |
| 8,422,171 B1* | 4/2013 | Guerini | ................ | G11B 5/4846 360/244.1 |
| 8,477,459 B1* | 7/2013 | Pan | ................ | G11B 5/4833 360/245.9 |
| 8,760,812 B1* | 6/2014 | Chen | ................ | G11B 5/486 360/244.1 |
| 8,941,952 B1* | 1/2015 | Pan | ................ | G11B 5/4846 360/244.1 |
| 9,330,695 B1* | 5/2016 | Chen | ................ | G11B 5/48 |
| 9,674,940 B2* | 6/2017 | Lee | ................ | H05K 1/0206 |
| 9,972,347 B1* | 5/2018 | Pan | ................ | G11B 5/4833 |
| 10,151,959 B2* | 12/2018 | Miyazaki | ................ | H05K 1/113 |
| 10,231,336 B2* | 3/2019 | Furutani | ................ | H05K 3/24 |
| 2001/0030836 A1* | 10/2001 | Katsumata | ............. | G11B 5/486 360/244.1 |
| 2002/0105761 A1* | 8/2002 | Abe | ................ | G11B 5/584 360/264.2 |
| 2003/0002222 A1* | 1/2003 | Abe | ................ | G11B 5/486 360/264.2 |
| 2004/0179306 A1* | 9/2004 | Kaneko | ............. | G11B 5/486 360/264.2 |
| 2005/0013051 A1* | 1/2005 | Katsumata | ............. | G11B 5/486 360/244.1 |
| 2005/0188531 A1* | 9/2005 | Shu | ................ | G11B 5/4826 29/603.03 |
| 2005/0190489 A1* | 9/2005 | Izumi | ............. | G11B 5/4846 360/97.19 |
| 2007/0153427 A1* | 7/2007 | Izumi | ............. | G11B 33/122 360/264.2 |
| 2008/0298218 A1* | 12/2008 | Tanaka | ............. | G11B 5/4846 369/126 |
| 2010/0007991 A1* | 1/2010 | Kohei | ............. | G11B 5/486 360/234.3 |
| 2010/0326726 A1* | 12/2010 | Tanaka | ............. | H05K 3/363 174/84 R |
| 2011/0102935 A1* | 5/2011 | Nagaoka | ............. | G11B 5/486 360/75 |
| 2013/0284498 A1* | 10/2013 | Sugimoto | ............. | H05K 13/00 174/250 |
| 2015/0162034 A1* | 6/2015 | Chen | ............. | G11B 5/4846 360/244.7 |
| 2015/0356986 A1* | 12/2015 | Pan | ............. | G11B 5/4846 360/244.1 |
| 2016/0012834 A1* | 1/2016 | Chen | ............. | G11B 5/4853 29/603.2 |
| 2016/0210990 A1* | 7/2016 | Chen | ............. | G11B 5/4853 |
| 2016/0314808 A1* | 10/2016 | Iwahara | ............. | G11B 5/4846 |
| 2017/0154645 A1* | 6/2017 | Pan | ............. | G11B 5/4833 |
| 2019/0287558 A1* | 9/2019 | Hasegawa | ............. | G11B 5/4813 |
| 2019/0295600 A1* | 9/2019 | Yoshikawa | ............. | G11B 5/4853 |

FOREIGN PATENT DOCUMENTS

| | | |
|---|---|---|
| JP | 2019-51542 A | 4/2019 |
| WO | WO 2009/081518 A1 | 7/2009 |

\* cited by examiner

ELECTRONIC DEVICE

CROSS-REFERENCE TO RELATED APPLICATIONS

This application is based upon and claims the benefit of priority from Japanese Patent Application No. 2019-051542, filed Mar. 19, 2019, the entire contents of which are incorporated herein by reference.

FIELD

Embodiments described herein relate generally to an electronic device.

BACKGROUND

Conventionally, there has been known a configuration in which a flexible printed wiring board and a connection end portion (connection member) provided with a connection terminal are connected by, for example, a heated and melted solder.

Here, in a case where a connection region between the flexible printed wiring board and the connection member is relatively large, even when the connection region is heated uniformly, an outer edge portion is more likely to dissipate heat than a central portion. Therefore, it is easy to get low temperature. That is, when the connection region is relatively large, temperature unevenness may occur in the connection region and uniform connection it may be difficult. A connection device can be improved to heat the connection region uniformly, but it involves an expense.

DETAILED DESCRIPTION

An object of the embodiment of the present invention is to provide an electronic device capable of sufficiently connecting a flexible printed wiring board and a connection member.

In general, according to one embodiment, an electronic device comprises: a flexible printed wiring board comprising an insulating layer, a plurality of connection pads provided on one side of the insulating layer and constituting a group, and a pad provided on another surface side of the insulating layer and having heat conductivity, wherein the pad overlaps one or more connection pads positioned at an outer edge of the group of connection pads via the insulating layer and comprises a portion extending on the outside of the connection pad on the outer edge, and a connection member comprising a plurality of connection terminals connected to the connection pads via a solder.

Hereinafter, an electronic device according to an embodiment will be described with reference to the drawings.

The disclosure is merely an example, and appropriate modifications which can be easily conceived by those skilled in the art without departing from the spirit of the invention are naturally included in the scope of the present invention. Although the drawings may be schematically represented with respect to the width, thickness, shape, and the like of each portion in comparison with an actual embodiment so as to make the description clearer, this is merely an example and it is not intended to limit the interpretation of the present invention. In the specification and the drawings, components similar to those described above with respect to the preceding drawings may be denoted by the same reference numerals, and detailed description thereof will be appropriately omitted.

First Embodiment

As an electronic device, a hard disk drive (HDD) according to a first embodiment will be described in detail.

Figure 1:
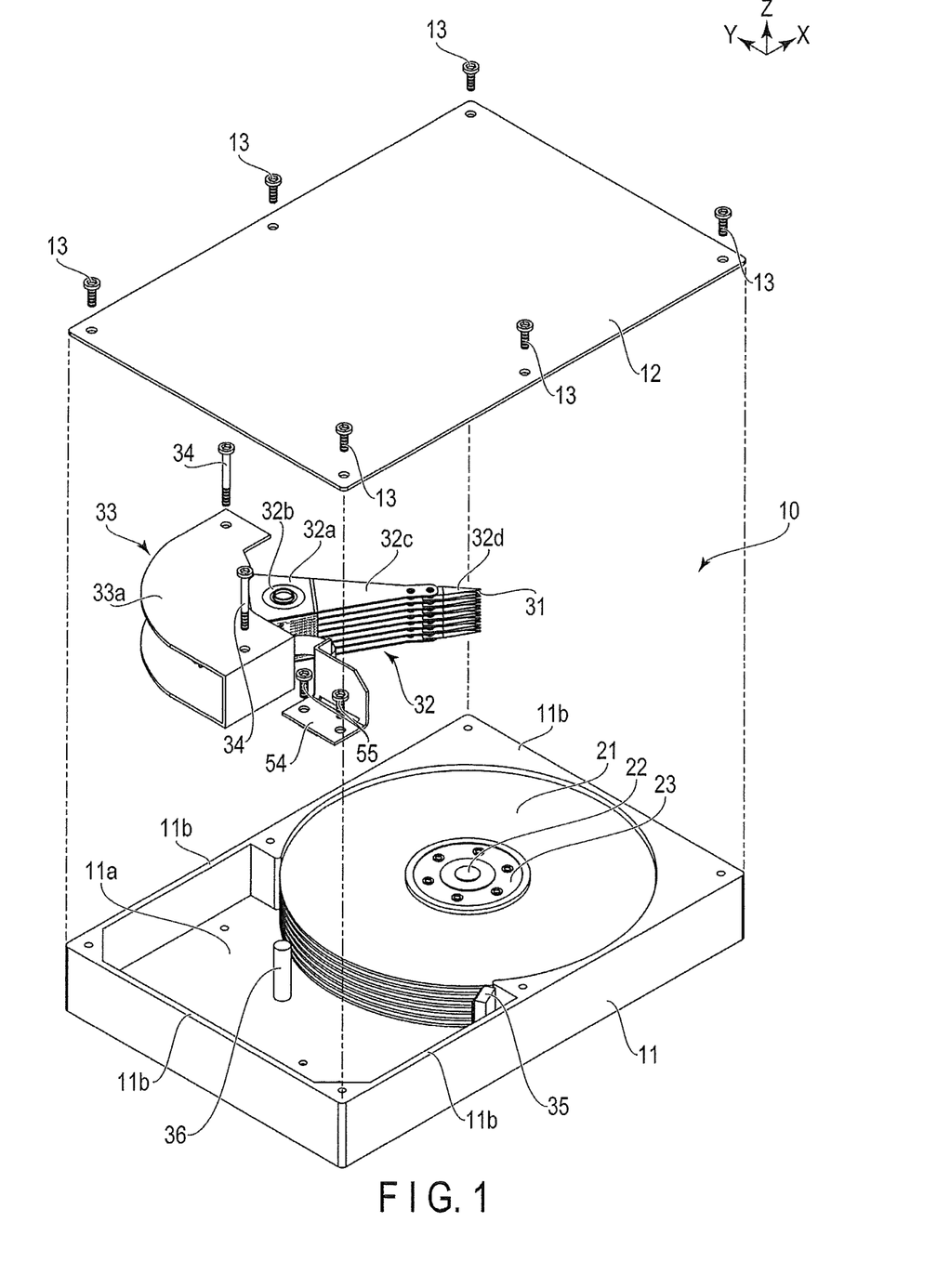
FIG. 1 is an exploded perspective view of a hard disk drive (HDD) including an electronic device according to a first embodiment.

FIG. 1 is an exploded perspective view of an HDD including an electronic device according to a first embodiment.

The HDD includes a housing 10 having a flat and substantially rectangular shape. The housing 10 includes a base 11 having a rectangular box with an opened upper surface, and a top cover 12. The base 11 includes a rectangular bottom wall 11a facing the top cover 12 with a gap therebetween, and a plurality of side walls 11b provided upright along the periphery of the bottom wall 11a and is integrally formed of, for example, aluminum. The top cover 12 is formed of, for example, stainless steel in a rectangular plate shape. The top cover 12 is screwed to the side walls 11b of the base 11 by a plurality of screws 13 and closes the upper opening of the base 11.

A plurality of magnetic disks 21 as a recording medium and a spindle motor 22 as a driving unit which supports and rotates the magnetic disks 21 are provided in the housing 10. The spindle motor 22 is disposed on the bottom wall 11a. Each of the magnetic disks 21 includes, for example, a 3.5-inch magnetic recording layer on an upper surface and/or a lower surface. Each of the magnetic disks 21 is coaxially fitted to a hub (not illustrated) of the spindle motor 22 and clamped by a clamp spring 23, and is fixed to the hub. Each of the magnetic disks 21 is supported in a state of being positioned parallel to the bottom wall 11a of the base 11. The plurality of magnetic disks 21 are rotated by the spindle motor 22 at a predetermined rotational speed. In the present embodiment, for example, seven magnetic disks 21 are accommodated in the housing 10, but the number of magnetic disks 21 is not limited thereto.

A plurality of magnetic heads 31 which record and read information on and from the magnetic disks 21, and an actuator assembly (carriage assembly) 32 which movably supports these magnetic heads 31 with respect to the magnetic disks 21 are provided in the housing 10. In addition, a voice coil motor (hereinafter referred to as a VCM) 33 which rotates and positions the actuator assembly 32, and a plurality of screws 34 which screw the VCM 33 to the bottom wall 11a of the base 11 are provided in the housing 10. Furthermore, a ramp loading mechanism 35 which holds the magnetic head 31 at an unloading position separated from the magnetic disk 21 when the magnetic head 31 moves to the outermost periphery of the magnetic disk 21 is provided in the housing 10.

The actuator assembly 32 includes an actuator block 32a rotatably supported around a support shaft 36 via a bearing unit 32b, the rotatable bearing unit 32b, a plurality of arms 32c extending from the actuator block 32a, and a suspension assembly 32d extending from each arm 32c. The magnetic head 31 is supported at the tip of each suspension assembly 32d. The support shaft 36 is provided upright on the bottom wall 11a.

A printed circuit board (not illustrated) is screwed to the outer surface of the bottom wall 11a of the base 11. The printed circuit board constitutes a control unit, and the control unit controls the operation of the spindle motor 22 and also controls the operations of the VCM 33 and the magnetic head 31 via the FPC unit 50.

Figure 2:
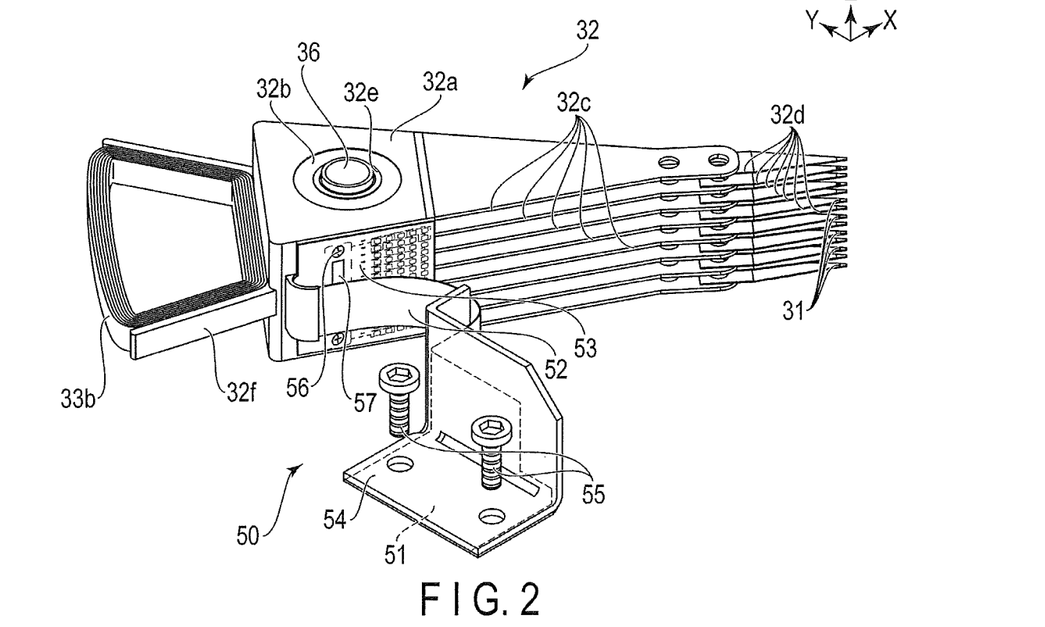
FIG. 2 is a perspective view illustrating an actuator assembly and a substrate unit (FPC unit) of the HDD.
Figure 3:
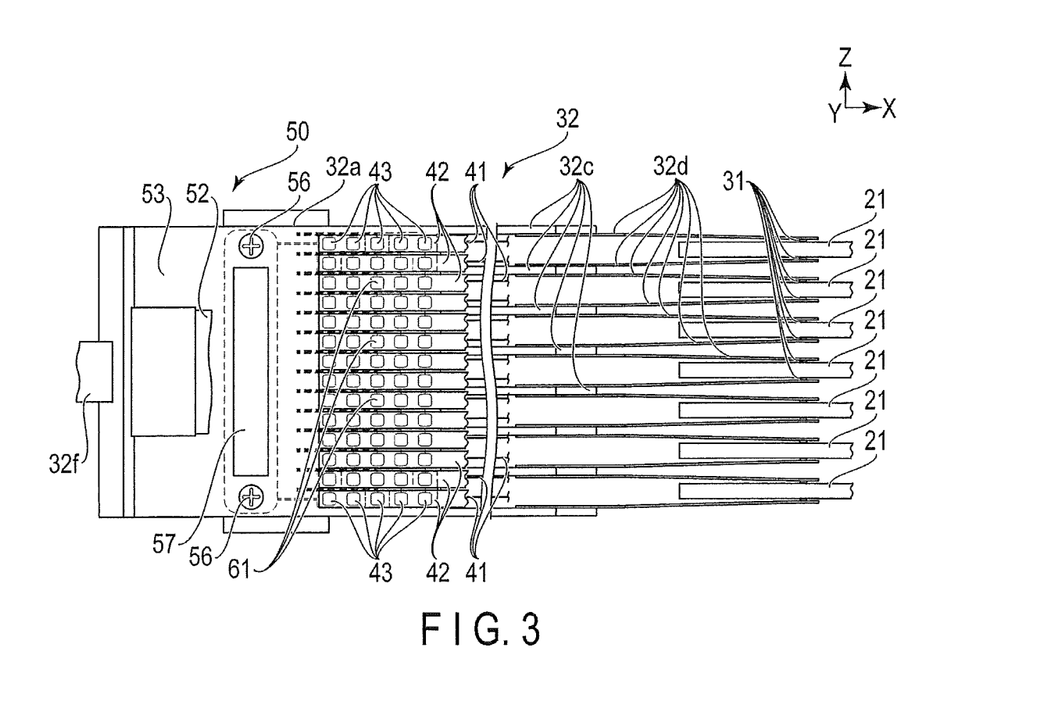
FIG. 3 is a side view illustrating an actuator block of the actuator assembly, a bonding portion (FPC bonding portion) of the FPC unit, and a connection end portion of a flexure.

FIG. 2 is a perspective view illustrating the actuator assembly 32 and the FPC unit 50. FIG. 3 is a side view illustrating a bonding portion 53 and a plurality of connection end portions 42 attached to the actuator block 32a.

The actuator assembly 32 includes an actuator block 32a having a through hole 32e, a bearing unit (unit bearing) 32b provided in the through hole 32e, a plurality of arms 32c, for example, eight arms 32c extending from the actuator block 32a, and fourteen suspension assemblies 32d attached to the respective arms 32c. The actuator block 32a is rotatably supported by the bearing unit 32b around the support shaft (pivot) 36 provided upright on the bottom wall 11a.

In the present embodiment, the actuator block 32a and the eight arms 32c are integrally formed of aluminum or the like to constitute a so-called E block. The arm 32c is formed in, for example, an elongated flat plate shape and extends from the actuator block 32a in a direction orthogonal to the support shaft 36. The eight arms 32c are provided in parallel with a gap therebetween.

The actuator assembly 32 includes a support frame 32f extending from the actuator block 32a in a direction opposite to the arm 32c. A voice coil 33b constituting a part of the VCM 33 is supported by the support frame 32f. As illustrated in FIG. 1, the voice coil 33b is positioned between a pair of yokes 33a, one of which is fixed on the base 11, and constitutes the VCM 33 together with the yokes 33a and magnets fixed to the yokes 33a.

The actuator assembly 32 includes fourteen suspension assemblies 32d which support the magnetic heads 31, respectively. The suspension assemblies 32d are attached to the tips of the respective arms 32c. The fourteen suspension assemblies 32d include seven up head suspension assemblies which support the magnetic heads 31 upward and seven down head suspension assemblies which support the magnetic heads 31 downward. The up head suspension assemblies and the down head suspension assemblies are configured by arranging the suspension assemblies 32d having the same structure in the up-and-down direction.

The down head suspension assemblies 32d and the up head suspension assemblies 32d of each set are positioned in parallel with each other at a predetermined interval, and the magnetic heads 31 are positioned to face each other. These magnetic heads 31 are positioned to face both sides of the corresponding magnetic disk 21.

In the present embodiment, in FIGS. 2 and 3, the down head suspension assembly 32d is attached to the uppermost arm 32c, and the up head suspension assembly 32d is attached to the lowermost arm 32c. The up head suspension assembly 32d and the down head suspension assembly 32d are attached to each of the middle six arms 32c.

Figure 4:
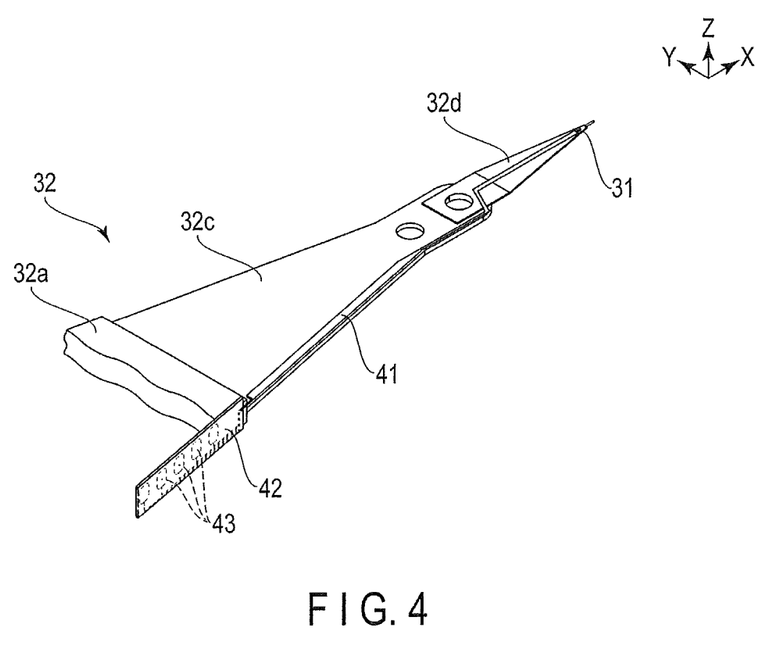
FIG. 4 is a perspective view illustrating a suspension assembly in the actuator assembly.

FIG. 4 is a perspective view illustrating the suspension assembly 32d.

The suspension assembly 32d includes a flexure (wiring member) 41 having an elongated band shape. The flexure 41 includes a metal plate (backing layer) such as stainless steel as a base, an insulating layer formed on the metal plate, a conductive layer constituting a plurality of wirings (wiring patterns) formed on the insulating layer, and a cover layer (protective layer, insulating layer) covering the conductive layer. The flexure 41 is in the form of a laminate having an elongated band shape. The wiring of the flexure 41 is electrically connected to a read element, a write element, a heater, and other members of the magnetic head 31.

A connection end portion (tail connection terminal portion) 42 is provided in the flexure 41. The connection end portion 42 is formed in an elongated rectangular shape extending in a horizontal direction. For example, fourteen connection end portions 42 are provided along a vertical direction.

A plurality of connection terminals (connection pads) 43 are provided in the connection end portion 42. The connection terminals 43 are respectively connected to the wirings of the flexure 41. That is, the plurality of wirings of the flexure 41 extend over substantially the entire length of the flexure 41. One end of the wiring is electrically connected to the magnetic head 31, and the other end of the wiring is connected to the connection terminal (connection pad) 43 of the connection end portion 42. A solder 44 is formed on the connection terminal 43. Here, the solder 44 can be formed of a solder having a melting point lower than that of a solder 45 described later. Specifically, the specification of a bump of a head IC 57 can be, for example, Sn (tin)-3.0Ag (silver)-0.5Cu (copper), and the specification of the solder 44 can be, for example, Sn-57Bi (bismuth)-1Ag. In such a configuration, the connection pad 61 and the head IC 57 can be soldered at 204° C. to 217° C. by using the solder 44 corresponding to the low melting-point solder. The connection end portion 42 (connection member), in which the connection terminal 43 is provided, is electrically connected to the connection pad 61.

As illustrated in FIG. 2, the FPC unit 50 integrally includes a base portion 51 having a substantially rectangular shape, a relay portion 52 having an elongated band shape extending from one side edge of the base portion 51, and a bonding portion (FPC bonding portion) 53 having a substantially rectangular shape and provided continuously to the tip of the relay portion 52. The base portion 51, the relay portion 52, and the bonding portion 53 are formed by a flexible printed wiring board (FPC). The flexible printed wiring board (FPC) is configured as a multilayer circuit board having two conductive layers. The detailed configuration of the FPC unit 50 will be described below.

Electronic components such as a conversion connector (not illustrated) and a plurality of capacitors are mounted on one surface (outer surface) of the base portion 51 and electrically connected to wirings (not illustrated). A reinforcing plate 54 is attached to the other surface (inner surface) of the base portion 51. The base portion 51 is bent along a plurality of reinforcing plates 54 which are bent in different directions. The base portion 51 is disposed on the bottom wall 11a of the housing 10 and is screwed to the bottom wall 11a by a plurality of screws 55 via the reinforcing plate 54. The conversion connector on the base portion 51 is connected to a control circuit board provided on the bottom surface side of the housing 10.

The relay portion 52 extends from the base portion 51 toward the actuator assembly 32. The bonding portion 53 provided at the extension end of the relay portion 52 is formed in a rectangular shape having substantially the same height and width as those of the side surface (installation surface) of the actuator block 32a. The bonding portion 53 is attached to the installation surface of the actuator block 32a via a backing plate formed of aluminum or the like and is further screwed and fixed to the installation surface by a fixing screw 56.

The bonding portion 53 is electrically connected to the connection end portion 42 of the flexure 41 in which fourteen wirings thereof are provided at the upper and lower sides. The head IC 57 (semiconductor element) is mounted on the bonding portion 53, and the head IC 57 is connected to the connection end portion 42 and the base portion 51 via the wiring of the FPC. The solder 45 which bonds the head IC 57 is a solder having a melting point higher than that of the solder 44 bonded to the connection pad 61. Specifically, the specification of the bump of the head IC 57 can be, for example, Sn-0.75Cu, and the specification of the solder 45 can be, for example, Sn-3.0Ag-0.5Cu. In such a configuration, the connection end portion 42, the base portion 51, and the head IC 57 can be soldered at 225° C. or less by using the solder 45 corresponding to high melting-point solder.

Furthermore, the bonding portion 53 includes a pair of connection pads, and the voice coil 33b is connected to these connection pads.

The fourteen magnetic heads 31 of the actuator assembly 32 are electrically connected to the base portions 51 through the wirings of the flexure 41, the connection end portions 42, the bonding portions 53 of the FPC unit 50, and the relay portions 52, respectively. Furthermore, the base portion 51 is electrically connected to the printed circuit board on the bottom surface side of the housing 10 via the conversion connector.

The wiring structure and the soaking structure of the connection end portion 42 and the bonding portion 53 of the FPC unit 50 will be described.

Figure 5:
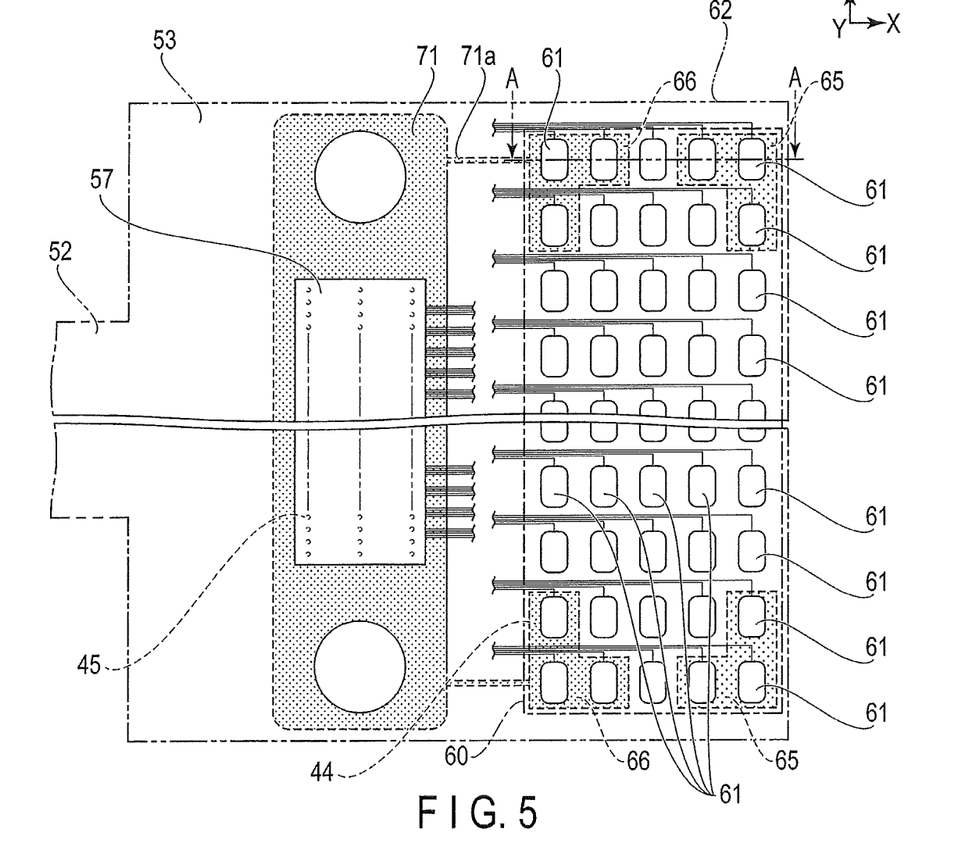
FIG. 5 is a plan view illustrating a bonding portion of the FPC unit.
Figure 6:
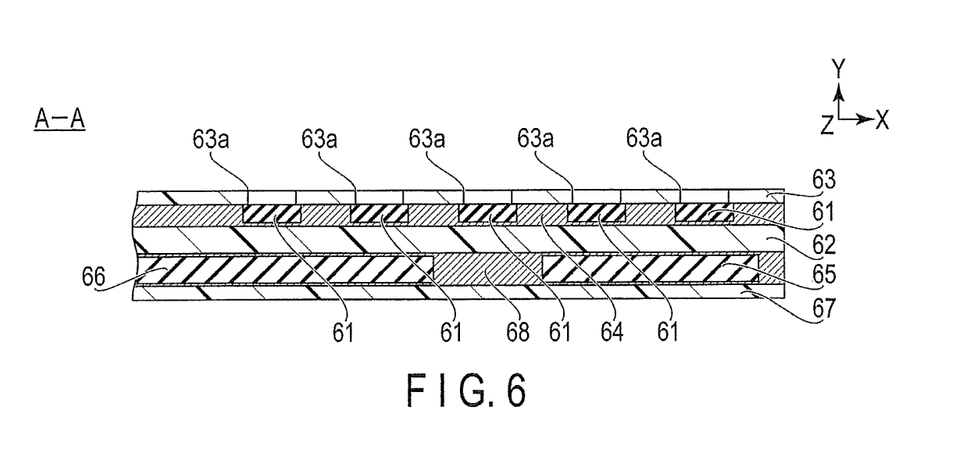
FIG. 6 is a cross-sectional view of an FPC bonding portion, taken along line A-A of FIG. 5.
Figure 7:
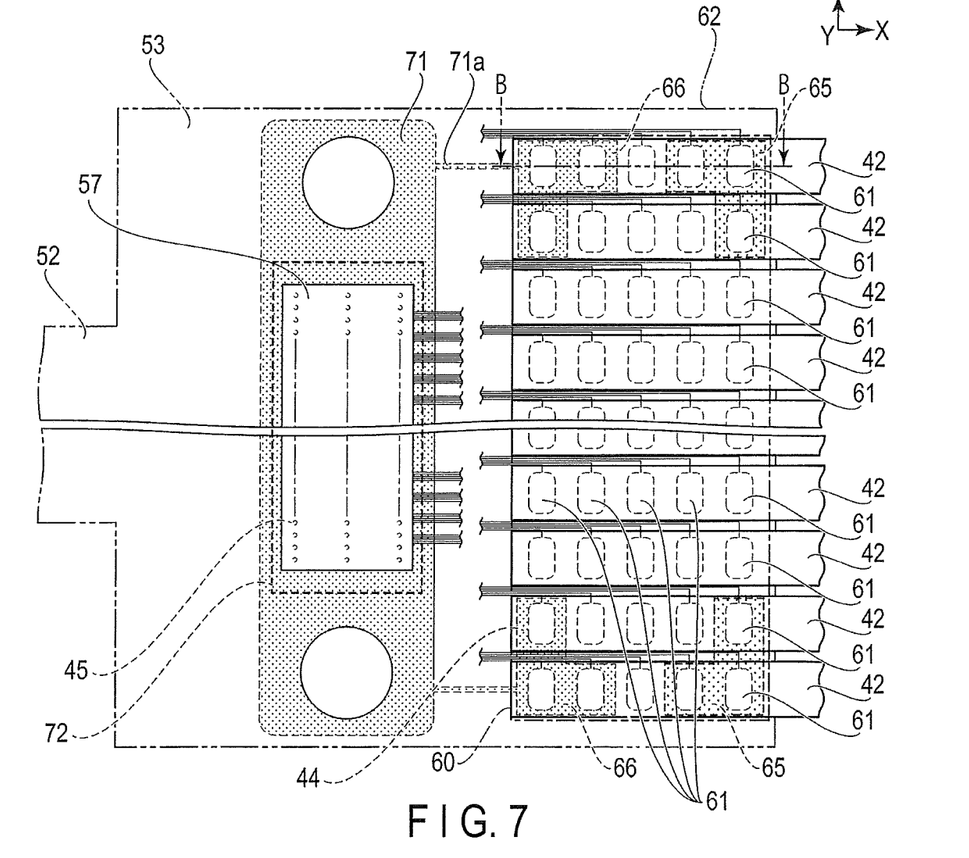
FIG. 7 is a plan view illustrating a bonding portion of the FPC unit to which the connection end portion is bonded.
Figure 8:
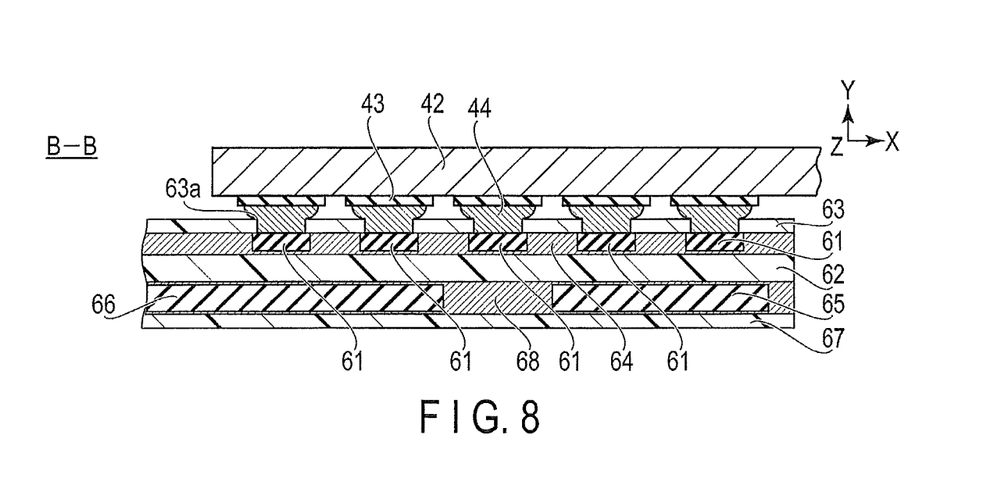
FIG. 8 is a cross-sectional view of the connection end portion and the FPC bonding portion, taken along line B-B of FIG. 7.
Figure 9:
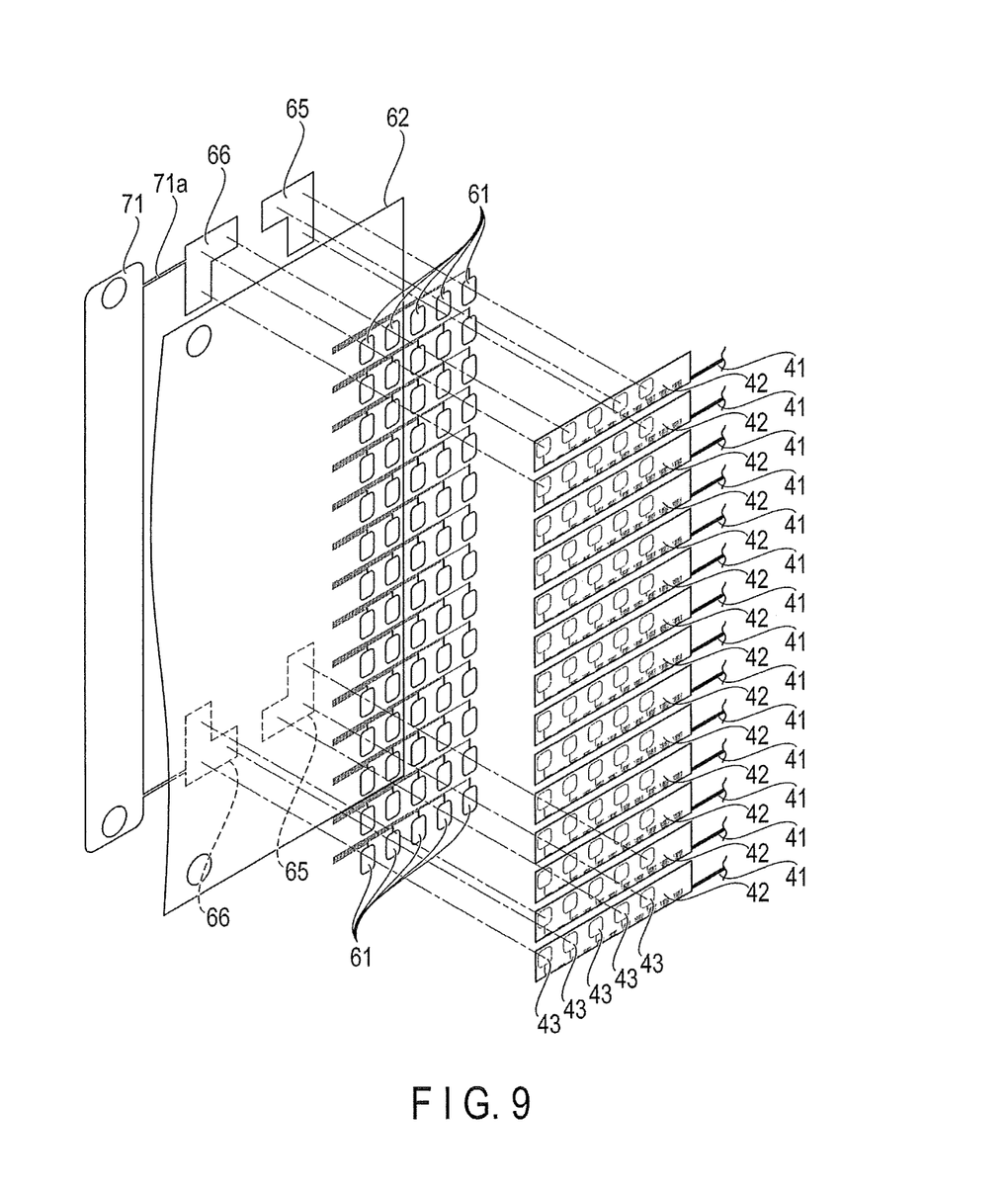
FIG. 9 is a perspective view schematically illustrating main parts of the connection end portion and the FPC unit.

FIG. 5 is a plan view illustrating the bonding portion 53 of the FPC unit 50. FIG. 6 is a cross-sectional view of the FPC bonding portion taken along line A-A of FIG. 5. FIG. 7 is a plan view illustrating the bonding portion 53 of the FPC unit 50 to which the connection end portion 42 is bonded. FIG. 8 is a cross-sectional view of the connection end portion 42 and the FPC bonding portion, taken along line B-B of FIG. 7. FIG. 9 is a perspective view schematically illustrating main parts of the connection end portion 42 and the FPC unit 50.

As illustrated in FIGS. 3 and 5, the bonding portion 53 of the FPC includes fourteen connection pad groups corresponding to the connection end portions 42 of the suspension assembly 32d. Each of the connection pad groups includes a plurality of connection pads 61 provided in a row, and each of the connection pads 61 is electrically connected to the head IC 57 via a wiring. The plurality of connection pads 61 of each connection pad group are arranged in a row at predetermined intervals in a direction substantially parallel to the arm 32c. In addition, the fourteen connection pad groups are arranged in a direction parallel to the support shaft 36, that is, in a height direction of the actuator block 32a, at predetermined intervals from one another and substantially parallel to one another. The connection pads 61 are exposed to the outside through rectangular openings 63a formed in a first cover insulating layer 63 of the FPC which will be described below.

As illustrated in FIGS. 5 and 6, the flexible printed wiring board constituting the bonding portion 53 includes, for example, an insulating layer 62 formed of polyimide or the like, a conductive layer attached to one side of the insulating layer 62 by an adhesive layer 64 and formed of, for example, copper foil, and a first cover insulating layer 63 overlapped and stacked on the conductive layer and the insulating layer 62. The conductive layer is patterned to constitute a plurality of connection pads 61 and a plurality of wirings. A plurality of openings 63a respectively facing the connection pads 61 are provided in the first cover insulating layer 63. The connection pads 61 are respectively exposed to the outside via the openings 63a.

The flexible printed wiring board further includes a second conductive layer attached to the other surface of the insulating layer 62 by an adhesive layer 68 and formed of, for example, copper foil, and a second cover insulating layer 67 attached to overlap the second conductive layer and the insulating layer 62 by the adhesive layer 68. The second conductive layer is patterned to constitute a plurality of pads 65 and 66, a plurality of wirings, a ground pad 71, and the like.

As illustrated in FIGS. 5 and 6, one pair of pads 65 overlap, for example, three connection pads 61 positioned at the outer edge via the insulating layer 62 at two corners facing in a vertical direction on the right side of the drawing among connection pad groups 60 including a plurality of connection pads 61 and constituting an electrical group. The pad 65 includes a portion protruding outward along the insulating layer 62 with respect to the three connection pads 61. One pair of pads 66 overlap, for example, three connection pads 61 positioned at the outer edge via the insulating layer 62 at two corners facing in a vertical direction on the left side of the drawing among the connection pad groups 60. The pad 66 includes a portion protruding outward along the insulating layer 62 with respect to the three connection pads 61. As illustrated in FIG. 5, the pair of pads 66 are electrically connected to the ground pad 71 provided in the bonding portion 53 via a ground pattern 71a.

As illustrated in FIGS. 7 and 8, in a state in which the connection end portion 42 attached with the solder 44 is placed on the connection pad 61, a predetermined region is irradiated with a laser beam and the solder 44 is melted. Therefore, each connection terminal 43 is bonded to the corresponding connection pad 61 via the solder 44. Prior to that, the head IC 57 is connected to the terminal of the second connection pad 72 by the solder 45 having a melting point higher than that of the solder 44.

According to the electronic device of the first embodiment which is configured as described above, the pad 65 overlaps one or more connection pads 61 positioned at the outer edge of the group of connection pads 61 via the insulating layer 62 and includes a portion protruding outward along the insulating layer 62 with respect to the connection pad 61 positioned at the outer edge. Therefore, when the group of connection pads 61 is heated by using a laser beam or the like for bonding, the outer portion of the pad 65 protruding from the connection pad 61 is heated by the laser beam, and the heat is transmitted to the entire pad 65 to heat the entire pad 65. Therefore, one or more connection pads 61 positioned at the outer edge of the group of connection pads 61 which are likely to be relatively low in temperature can be uniformly heated by using the pads 65. That is, the connection pad 61 is heated from not only a region which overlaps the pad 65 but also a region in which the connection pad 61 is not present. Therefore, it is possible to uniformly heat the solder throughout the bonding region, and it is possible to reliably and electrically connect all the connection pads 61 of the bonding portion and the connection terminals 43 of the connection end portion 42.

From the above, it is possible to obtain the electronic device which can sufficiently connect the FPC unit 50 (flexible printed wiring board) and the connection end portion 42 (connection member) in which the connection terminal 43 is provided.

In addition, according to the electronic device of the first embodiment, the pad 65 and the pad 66 overlap the entire region of one or more connection pads 61 positioned at the outer edge of the group of connection pads 61 via the insulating layer 62. Therefore, the connection pad 61 can be uniformly heated by using the pad 65 and the pad 66.

In addition, according to the electronic device of the first embodiment, the pad 65 and the pad 66 are connected to the ground pad 71 via the ground pattern 71a. Therefore, an electrical noise caused by the pad 65 and the pad 66 can be suppressed. In addition, the pad 65 and the pad 66 can be inexpensively configured by the same conductive layer as the ground pad 71. That is, it is not necessary to provide a new layer so as to form the pad 65 and the pad 66.

In addition, according to the electronic device of the first embodiment, the FPC unit 50 includes the plurality of groups of connection pads 61 provided in a plurality of rows on one surface side of the insulating layer 62. The pads include the plurality of pads 65 and 66 disposed to overlap one or more connection pads 61 positioned at the end portion of each group. Therefore, the FPC unit 50 can be configured according to various specifications according to the heat conductivity or the heat storage property.

Furthermore, according to the electronic device of the first embodiment, the plurality of pads include the plurality of pads 65 and 66 having different areas. Therefore, the specification of the pad can be made different according to the temperature distribution (temperature unevenness).

In addition, according to the electronic device of the first embodiment, the FPC unit 50 includes the plurality of second connection pads 72 provided on one surface side of the insulating layer 62, and the head IC 57 (semiconductor element) bonded to the second connection pads 72 by the solder 45. The solder 45 which bonds the head IC 57 is a solder having a melting point higher than that of the solder 44 bonded to the connection pad 61. Therefore, after the head IC 57 is mounted on the second connection pad 72 by using the solder 45, the connection pad 61 and the connection terminal 43 provided at the connection end portion 42 can be sufficiently soldered by the solder 44 which is melted at a temperature lower than that of the solder 45.

In addition, according to the electronic device of the first embodiment, it can be applied to the actuator assembly of the disk device. Thereby the FPC unit 50 and the connection end portion 42 can be sufficiently connected even when, as the capacity of disk device increases, the number of magnetic disks 21 installed tends to increase, the number of magnetic heads 31 increases by that amount, the area of the connection pad group 60 constituting the group of connection pads 61 increases, and a difference in the heating temperature between the central portion and the outer edge portion easily occurs.

In addition, according to the electronic device of the first embodiment, even when an air layer is generated between the actuator block 32a and the reinforcing plate due to the warping of the reinforcing plate which holds the FPC unit 50 and the heat variation becomes large, uniform energization is possible because uniform connection is possible by the configuration of the first embodiment.

Next, an electronic device according to another embodiment will be described. In another embodiment described below, the same reference numerals as in the first embodiment described above are assigned to the same parts as in the first embodiment, the detailed description thereof will be omitted or simplified, and the description will focus on parts different from those of the first embodiment.

Second Embodiment

Figure 10:
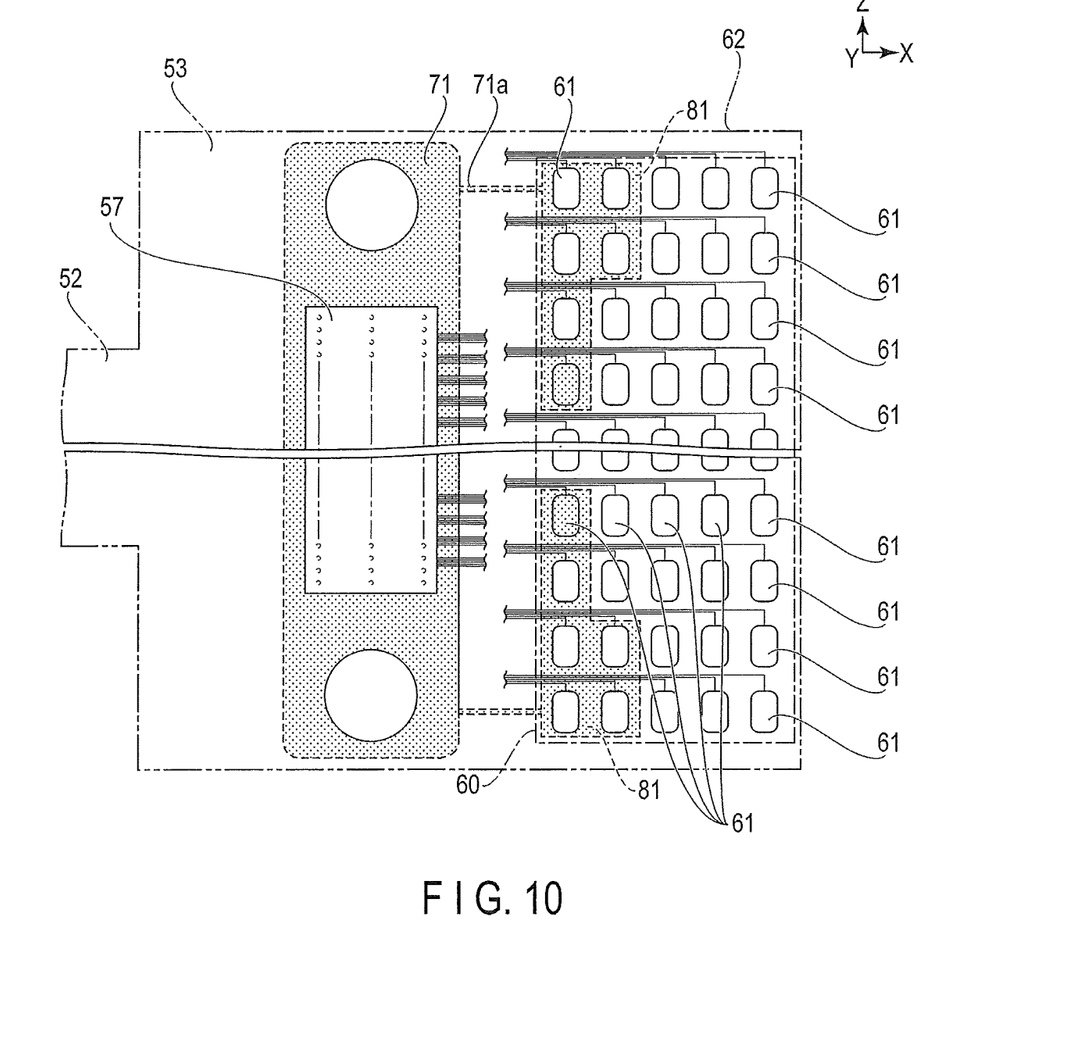
FIG. 10 is a plan view illustrating a bonding portion of an FPC unit according to a second embodiment.

FIG. 10 is a plan view illustrating a bonding portion of an FPC unit according to a second embodiment.

As illustrated in FIG. 10, a pad 81 overlaps, for example, six connection pads 61 positioned at the outer edge via an insulating layer 62 at two corners facing in a vertical direction on the left side of the drawing among connection pad groups 60. A pad 66 includes a portion protruding outward along the insulating layer 62 with respect to the six connection pads 61. One pair of pads 81 are electrically connected to a ground pad 71 provided in a bonding portion 53 via a ground pattern 71a.

According to the electronic device of the second embodiment, which is configured as described above, when a temperature gradient occurs in the connection pad group 60, the pad 81 can be efficiently provided to a proximal end portion which is relatively low in temperature.

Third Embodiment

Figure 11:
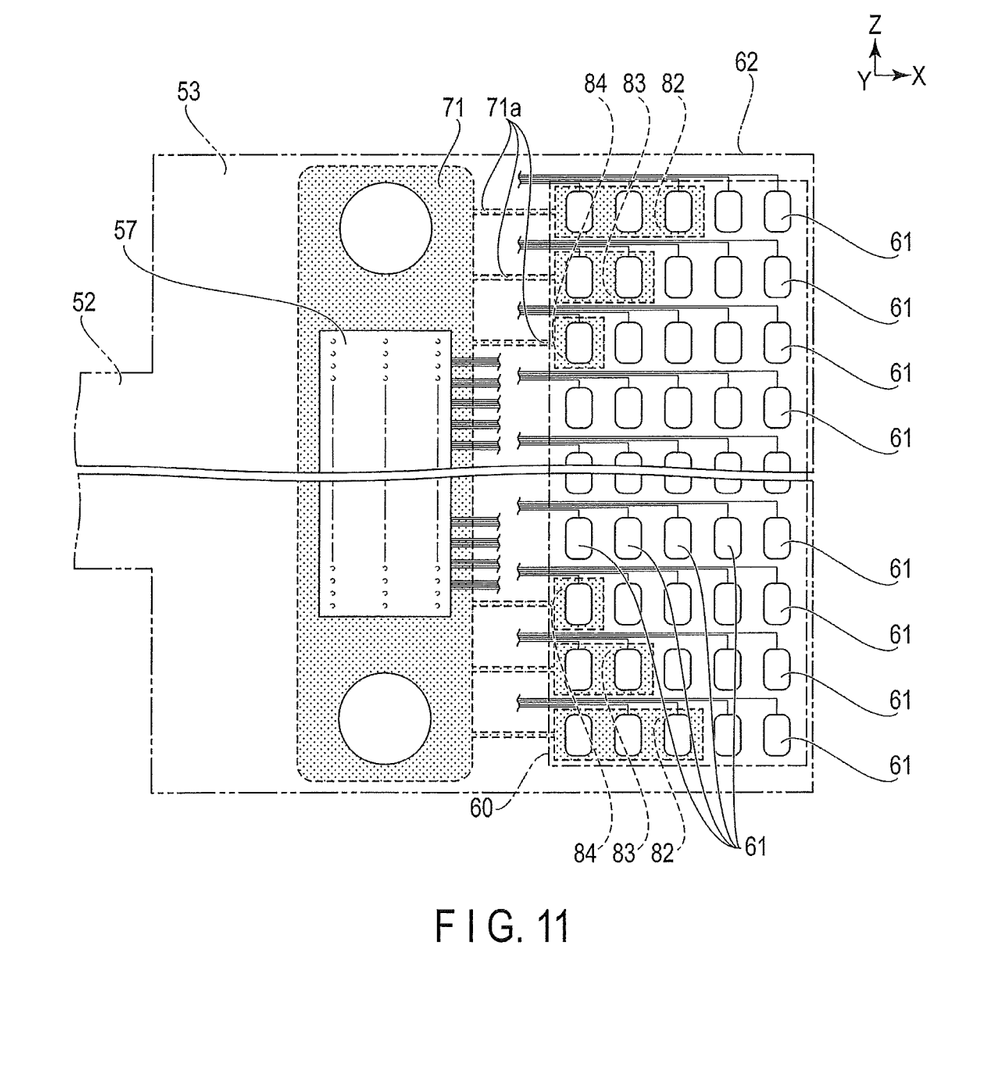
FIG. 11 is a plan view illustrating a bonding portion of an FPC unit according to a third embodiment.

FIG. 11 is a plan view illustrating a bonding portion of an FPC unit according to a third embodiment.

As illustrated in FIG. 11, a pad 82, a pad 83, and a pad 84 overlap connection pads 61 positioned at the outer edge via an insulating layer 62 at two corners facing in a vertical direction on the left side of the drawing among connection pad groups 60. The pad 82 is positioned on the outermost side of the connection pad group 60 and overlaps, for example, three connection pads 61 adjacent on the left and right via the insulating layer 62. The pad 83 is positioned inside the pad 82 in the connection pad group 60 and overlaps, for example, two connection pads 61 adjacent on the left and right via the insulating layer 62. The pad 84 is positioned inside the pad 83 in the connection pad group 60 and overlaps, for example, one connection pad 61 via the insulating layer 62. The pad 82, the pad 83, and the pad 84 each include a portion protruding outward along the insulating layer 62 with respect to the three connection pads 61. The pad 82, the pad 83, and the pad 84 are electrically connected to a ground pad 71 provided in a bonding portion 53 via a ground pattern 71a.

According to the electronic device of the third embodiment, which is configured as described above, as in the electronic device of the second embodiment, when a temperature gradient occurs in the connection pad group 60, the pad 82, the pad 83, and the pad 84 can be efficiently provided to a proximal end portion which is relatively low in temperature.

Fourth Embodiment

Figure 12:
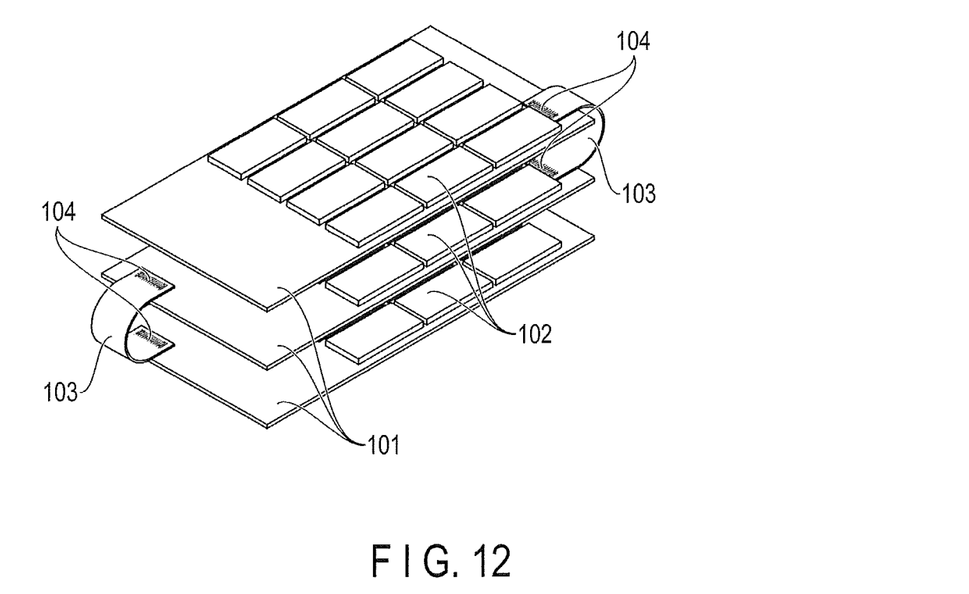
FIG. 12 is a perspective view of a solid state drive (SSD) including an electronic device according to a fourth embodiment.
Figure 13:
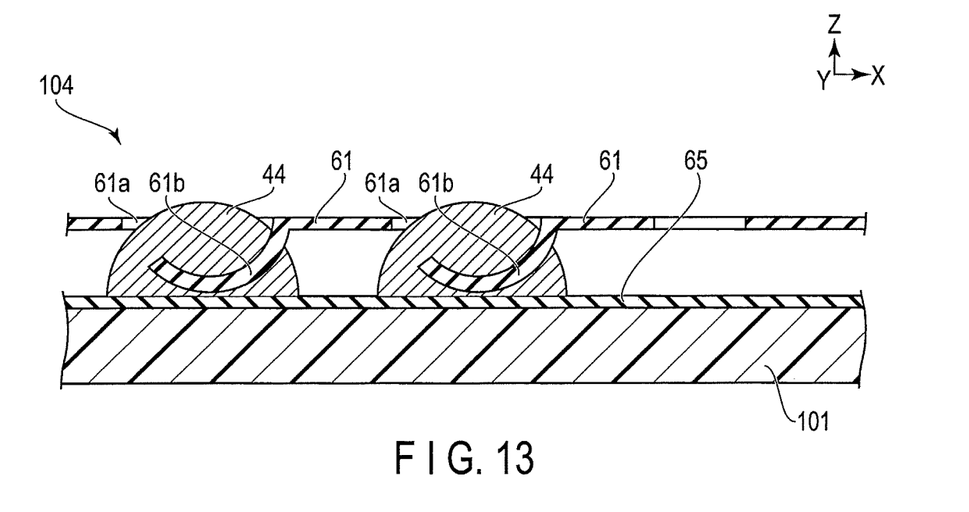
FIG. 13 is a cross-sectional view illustrating a first example of a main part of FIG. 12.
Figure 14:
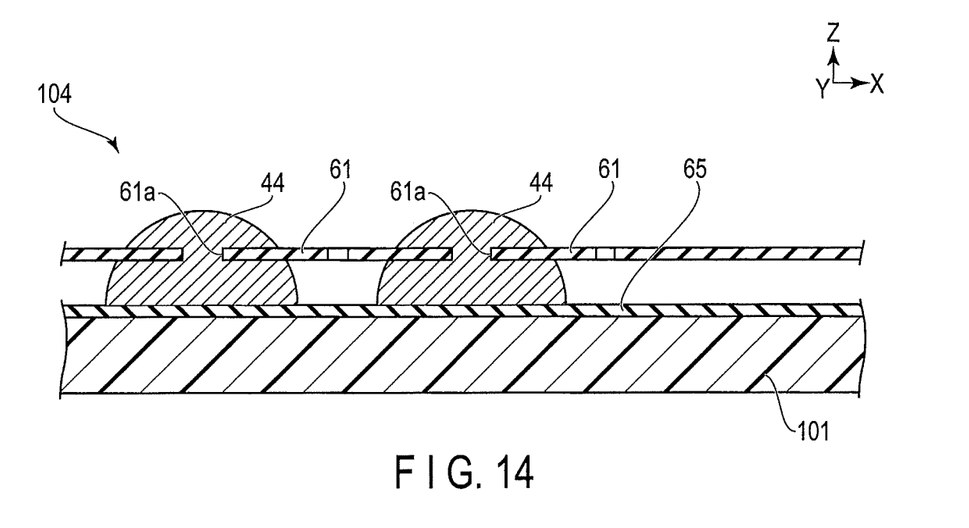
FIG. 14 is a cross-sectional view illustrating a second example of a main part of FIG. 12.

FIG. 12 is a perspective view of a solid state drive (SSD) including an electronic device according to a fourth embodiment. FIG. 13 is a cross-sectional view illustrating a first example of a main part in FIG. 12. FIG. 14 is a cross-sectional view illustrating a second example of a main part in FIG. 12.

As illustrated in FIG. 12, a solid substrate 101 on which a plurality of memories 102 are mounted is electrically connected to an FPC unit 103 (flexible printed wiring board) via a connection member 104 to constitutes an SSD having a relatively large recording capacity.

As illustrated in FIG. 13, as a first example, each connection pad 61 and a pad 65 formed on the solid substrate 101 can be soldered by a solder 44 via an opening 61a formed in each connection pad 61 and a protrusion portion 61b which is curved while being pushed out from the opening 61a to the pad 65 side.

As illustrated in FIG. 14, as a second example, a connection pad 61 and a pad 65 formed on the solid substrate 101 are soldered by a solder 44 via an opening 61a formed in the connection pad 61.

According to the electronic device of the fourth embodiment, which is configured as described above, the present invention can be applied to an SSD without being limited to the HDD.

The present invention is not limited to the above embodiments or modifications as they are, and the constituent components can be modified and embodied at the implementation stage without departing from the scope of the invention. In addition, various inventions can be formed by appropriate combinations of a plurality of constituent components disclosed in the above embodiments. For example, some constituent components may be deleted from all the components shown in the embodiments. Furthermore, constituent components in different embodiments may be combined as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
an actuator assembly comprising an actuator block with a side surface, and a suspension assembly extending from the actuator block, the suspension assembly comprising a support plate, a wiring member on the support plate, including an end portion and a connection end portion with a plurality of connection terminals, and a head provided on the end portion of the wiring member; and
a flexible printed wiring board comprising a bonding portion provided on the side surface of the actuator block, the flexible printed wiring board comprising an insulating layer, a plurality of connection pads provided on one side of the insulating layer at the bonding portion and constituting a group, a pad provided on another surface side of the insulating layer at the bonding portion and having heat conductivity, and a second insulating layer covering the pad and the another surface side of the insulating layer, wherein the pad overlaps one or more connection pads positioned at an outer edge of the group of connection pads via the insulating layer and comprises a portion extending on the outside of the connection pad on the outer edge,
wherein the second insulating layer of the bonding portion is on the side surface of the actuator block, the connection end portion of the wiring member is placed on the bonding portion to overlap the connection pads, and the connection terminals are connected to the connection pads via first solder.

2. The electronic device according to claim 1, wherein the pad overlaps an entire region of the one or more connection pads positioned at the outer edge of the group of connection pads via the insulating layer.

3. The electronic device according to claim 1, wherein the flexible printed wiring board comprises a ground pad provided on the another side of the insulating layer, and the pad is connected to the ground pad.

4. The electronic device according to claim 1, wherein the flexible printed wiring hoard comprises a plurality of groups of the connection pads provided in a plurality of rows on one surface side of the insulating layer at the bonding portion, and
the pad comprises a plurality of pads disposed to overlap the one or more connection pads positioned at the end portion of each of the groups.

5. The electronic device according to claim 4, wherein the pads have different areas.

6. The electronic device according to claim 1, wherein the flexible printed wiring board comprises a plurality of second connection pads provided on one surface side of the insulating layer, and a semiconductor element bonded to the second connection pad by a second solder, and
the second solder that bonds the semiconductor element has a melting point higher than that of the first solder bonded to the connection pads.

7. The electronic device of claim 1, wherein
the actuator assembly comprises a plurality of suspension assemblies extending from the actuator block in an extending direction and arranged in a direction perpendicular to the extending direction, each of the suspension assemblies comprising the support plate; the wiring member on the support plate, including the end portion and the connection end portion with a plurality of connection terminals, and the head provided on the end portion of the wiring member, the connection terminals of the connection end portion being arranged in a first direction; and
the flexible printed wiring board comprises a plurality of groups of the connection pads provided in a plurality of rows on one surface side of the insulating layer at the bonding portion, each of the rows including the connection pads arranged in the first direction and the plurality of rows are arranged in a direction crossing the first direction;
the connection end portions of the plurality of the suspension assemblies placed on the bonding portion to overlap the respective rows of the connection pads, and the connection terminals of each connection end portion are connected to the connection pads via the first solder;

the pad of the flexible printed wiring board includes a first pad and a second pad which are provided on the another surface side of the insulating layer and have heat conductivity, wherein the first pad overlaps one or more connection pads of the row positioned at one end outer edge of the group of connection pads via the insulating layer and comprises a portion extending on the outside of the connection pad on the one end outer edge, and the second pad overlaps one or more connection pads of the row positioned at other end outer edge of the group of connection pads via the insulating layer and comprises a portion extending on the outside of the connection pad on the other end outer edge.

* * * * *